(12) United States Patent
Hirabayashi et al.

(10) Patent No.: US 9,595,603 B2
(45) Date of Patent: Mar. 14, 2017

(54) SEMICONDUCTOR DEVICE

(71) Applicant: Toyota Jidosha Kabushiki Kaisha, Toyota-shi Aichi-ken (JP)

(72) Inventors: Yasuhiro Hirabayashi, Nagoya (JP); Masaru Senoo, Okazaki (JP); Akitaka Soeno, Toyota (JP); Satoru Machida, Nagakute (JP); Yusuke Yamashita, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/188,584

(22) Filed: Jun. 21, 2016

(65) Prior Publication Data

US 2017/0005186 A1  Jan. 5, 2017

(30) Foreign Application Priority Data

Jul. 2, 2015  (JP) ................. 2015-133673

(51) Int. Cl.
*H01L 29/06* (2006.01)
*H01L 29/739* (2006.01)
*H01L 29/36* (2006.01)
*H01L 29/10* (2006.01)

(52) U.S. Cl.
CPC ...... *H01L 29/7397* (2013.01); *H01L 29/1095* (2013.01); *H01L 29/36* (2013.01)

(58) Field of Classification Search
CPC ..... H01L 29/06; H01L 29/0696; H01L 29/10; H01L 29/1095; H01L 29/66; H01L 29/66333; H01L 29/73; H01L 29/7395; H01L 29/7397

USPC .......................................... 257/139
See application file for complete search history.

(56) References Cited

U.S. PATENT DOCUMENTS

| 9,214,526 | B2 * | 12/2015 | Takaya ................. H01L 29/7813 |
| 2008/0012040 | A1 | 1/2008 | Saito et al. |
| 2014/0054645 | A1 | 2/2014 | Saito et al. |
| 2014/0231867 | A1 | 8/2014 | Yamashita et al. |

FOREIGN PATENT DOCUMENTS

| JP | 2012-190938 A | 10/2012 |
| JP | 6087272 B2 | 12/2012 |
| JP | 2013-150000 A | 8/2013 |
| JP | 2014-157930 A | 8/2014 |

\* cited by examiner

*Primary Examiner* — Monica D Harrison
(74) *Attorney, Agent, or Firm* — Dinsmore & Shohl LLP (57) ABSTRACT

A semiconductor device includes a semiconductor layer and a trench gate portion that extends toward a deep portion from a front surface of the semiconductor layer. The semiconductor layer includes an island region surrounded by the trench gate portion. A first side surface of the trench gate portion and a second side surface of the trench gate portion are in contact with the island region. A first conductivity type contact region that includes a first contact region that is in contact with the first side surface and a second contact region that is in contact with the second side surface is provided in the island region. Moreover, a second conductivity type contact region that is in contact with the trench gate portion at a position between the first contact region and the second contact region is provided in the island region.

5 Claims, 8 Drawing Sheets

SEMICONDUCTOR DEVICE

CROSS-REFERENCE TO RELATED APPLICATION

This application claims priority based on Japanese Patent Application No. 2015-133673, filed on Jul. 2, 2015, the entire contents of which are hereby incorporated by reference into the present application.

TECHNICAL FIELD

The present teachings disclose an art related to a semiconductor device.

DESCRIPTION OF RELATED ART

A semiconductor device that includes a trench gate portion is disclosed in Japanese Patent Application Publication No. 2013-150000. In the semiconductor device in Japanese Patent Application Publication No. 2013-150000, when a semiconductor layer is seen in a plan view, a trench gate portion surrounds a portion of the semiconductor layer. An island region surrounded by the trench gate portion is provided in the semiconductor layer. The semiconductor device in Japanese Patent Application Publication No. 2013-150000 is an IGBT, and includes a p-type body region provided on a surface of an n-type drift region, a plurality of $n^+$-type emitter regions provided in a surface layer of the body region, and a $p^+$-type body contact region provided in the surface layer of the body region. The plurality of emitter regions is distributedly disposed in the island region. The emitter regions are in contact with different side surfaces of the trench gate portion, respectively. Moreover, the body contact region is disposed in the island region in a state of being apart from the trench gate portion.

SUMMARY

When an on-voltage is applied to a trench gate portion, a channel of electrons is formed at an interface between the trench gate portion and a body region. In a semiconductor device that includes a stripe-like trench gate portion, a channel that has a concentration corresponding to the on-voltage is formed equally in an entire region of the trench gate portion. However, if the trench gate portion forms an island region, there may be a case where emitter regions are connected to each other by the channel, in a surface of the island region. An amount of electrons injected from the emitter regions is increased, and current concentration occurs at corners of the island region, causing an increase in saturation current. Accordingly, in a semiconductor device of a type in which a trench gate portion forms an island region in a semiconductor layer, countermeasures to suppress an increase in saturation current are required. The present teachings disclose an art to provide a semiconductor device having saturation current suppressed.

A semiconductor device disclosed herein comprises a semiconductor layer and a trench gate portion that extends toward a deep portion from a front surface of the semiconductor layer. The semiconductor layer comprises: a drift region which is of a first conductivity type; a body region which is of a second conductivity type; a first conductivity type contact region; and a second conductivity type contact region. The body region is provided on a surface of the drift region. The first conductivity type contact region is provided in a portion of a surface layer of the body region, and is separated from the drift region by the body region. The second conductivity type contact region is provided in another portion of the surface layer of the body region (at a position different from a position of the first conductivity type contact region), and includes second conductivity type impurities of a higher concentration than that in the body region. Moreover, the semiconductor layer includes an island region surrounded by the trench gate portion in a plan view. The trench gate portion includes a first side surface that is in contact with the island region and a second side surface that is in contact with the island region and is different from the first side surface. In this semiconductor device, the first conductivity type contact region includes a first contact region that is in contact with the first side surface in the island region and a second contact region that is in contact with the second side surface in the island region. Moreover, the second conductivity type contact region is in contact with the trench gate portion at a position between the first contact region and the second contact region.

In the above-described semiconductor device, when an on-voltage is applied to the trench gate portion, a channel of the first conductivity type is formed at an interface between the body region and the trench gate portion. However, as described above, the second conductivity type contact region is in contact with the trench gate portion at a position between the first contact region and the second contact region in the surface layer of the island region. Even if an on-voltage is applied to the trench gate portion, no channel is formed at a portion with which the second conductivity type contact region is in contact. Accordingly, the first contact region and the second contact region are not linked by the channel in the surface layer of the island region. Consequently, when an on-voltage is applied to the trench gate portion, an increase in amount of electrons injected from the contact region (the first contact region and the second contact region) is suppressed, and an increase in saturation voltage can be suppressed.

DESCRIPTION OF EMBODIMENTS

Initially, some of characteristics of the art disclosed in the present teachings are summarized. Notably, each of the items described below independently has technical utility.

A semiconductor device disclosed herein includes a trench gate portion that extends toward a deep portion from a front surface of a semiconductor layer. The semiconductor device may be of a type in which one of a pair of main electrodes is provided on the front surface of the semiconductor layer, and the other of the pair of main electrodes is provided on a rear surface of the semiconductor layer (a vertical-type semiconductor device). Alternatively, the semiconductor device may be of a type in which both of the pair of main electrodes is provided on the front surface of the semiconductor layer (a horizontal-type semiconductor device). In some embodiments, the present teachings disclosed herein are applied to the vertical-type semiconductor device, in particular. The semiconductor device may be of a unipolar type (e.g., a MOSFET) or of a bipolar type (e.g., an IGBT).

The trench gate portion includes a gate electrode and a gate insulating film. The trench gate portion surrounds a portion of the semiconductor layer when the semiconductor layer is seen in a plan view. In other words, the semiconductor layer includes island regions surrounded by the trench gate portion. Each of the island region may be a quadrangle in a plan view. For example, the island region may be a square or a rectangle. The trench gate portion includes at least a first side surface that is in contact with the island region and a second side surface that is in contact with the island region and is different from the first side surface. The first side surface and the second side surface may be parallel to each other. In this case, the trench gate portion may further include third side surfaces being in contact with the island region and extending between the first side surface and the second side surface. Corners may be formed by the first side surface and the third side surfaces, and by the second side surface and the third side surfaces. Alternatively, the first side surface and the second side surface may be adjacent straight lines that share a vertex. In this case, a corner is formed by the first side surface and the second side surface.

The semiconductor layer includes a drift region which is of a first conductivity type, a body region which is of a second conductivity type, a first conductivity type contact region, and a second conductivity type contact region. Notably, if the first conductivity type is n-type, the second conductivity type is p-type. Conversely, if the first conductivity type is p-type, the second conductivity type is n-type. The body region is provided on a surface of the drift region. The above-described trench gate portion extends toward the deep portion from the front surface of the semiconductor layer, and reaches the drift region. The first conductivity type contact region is provided in a portion of a surface layer of the body region. The first conductivity type contact region is separated from the drift region by the body region. The first conductivity type contact region is in contact with the side surface of the trench gate portion.

A plurality of the first conductivity type contact regions is provided in each of the island regions. Each of the first conductivity type contact regions is separated from the other first conductivity type contact regions by the body region. Specifically, the first conductivity type contact region includes at least a first contact region that is in contact with the first side surface of the trench gate portion in the island region, and a second contact region that is in contact with the second side surface of the trench gate portion in the island region. The first contact region and the second contact region are separated from each other by the body region.

When an on-voltage is applied to the gate electrode, a channel (an inversion layer) that connects the first conductivity type contact region and the drift region is formed at an interface between the side surface of the trench gate portion and the body region. Through the channel, carriers are injected from the first conductivity type contact region into the drift region. Notably, if the semiconductor device is a MOSFET, for example, the first conductivity type contact region is referred to as a source region. Moreover, if the semiconductor device is an IGBT, for example, the first conductivity type contact region is referred to as an emitter region.

The second conductivity type contact regions are provided in another portion of the surface layer of the body region (i.e., a portion where no electron supply region is provided), and includes second conductivity type impurities of a higher concentration than that in the body region. Each of the second conductivity type contact region is in contact with the trench gate portion in the surface layer of the island region, at a position between the first contact region and the second contact region. Notably, the second conductivity type contact region may be in contact with the first side surface. If the second conductivity type contact region is in contact with the first side surface, the second conductivity type contact region may be in contact with an entire surface of the first side surface except for a portion with which the first conductivity type contact region is in contact, or may be in contact with a portion of the first side surface. Similarly, if the second conductivity type contact region is in contact with the second side surface, the second conductivity type contact region may be in contact with an entire surface of the second side surface except for a portion with which the first conductivity type contact region is in contact, or may be in contact with a portion of the second side surface.

In a configuration in which the first side surface and the second side surface are parallel to each other and the third side surfaces extend between the first side surface and the second side surface, the second conductivity type contact region may be in contact with all of the first side surface, the second side surface, and the third side surfaces. Moreover, the second conductivity type contact region may be in contact exclusively with the third side surfaces, and may not be in contact with the first side surface and the second side surface. Alternatively, the second conductivity type contact region may be in contact with at least one of the first side surface and the second side surface, and may not be in contact with the third side surfaces. The second conductivity type contact region may be in contact with the first side surface in a range from the corner formed by the first side surface and the third side surface to the first contact region. In this case, the second conductivity type contact region may be in contact with the corner formed by the first side surface and the third side surface. Moreover, the second conductivity type contact region may be in contact with the second side surface in a range from the corner formed by the second side surface and the third side surface to the second contact region. In this case, the second conductivity type contact region may be in contact with the corner formed by the second side surface and the third side surface.

If the second conductivity type contact region is in contact with all of the first side surface, the second side surface, and the third side surfaces, a range with which the second conductivity type contact region is not in contact may be provided in a portion of at least one of the first side surface, the second side surface, and the third side surfaces. In other words, the side surface of the trench gate portion may include a contact part with which the second conductivity type contact region is in contact, and a non-contact part with which the second conductivity type contact region is not in contact. In this case, the body region is located in a gap between the second conductivity type contact region and the side surface of the trench gate portion (the non-contact part). In some embodiments, an impurity concentration of the body region that is located in the gap between the second conductivity type contact region and the non-contact part is lower than a peak impurity concentration of the body region. In some embodiments, the second conductivity type contact region is not in contact with a portion of the third side surfaces. In some embodiments, the non-contact part is provided in the third side surfaces. In this case, the impurity concentration of the body region that is located in the gap between the second conductivity type contact region and the third side surface (the non-contact part) is lower than the peak impurity concentration of the body region.

EMBODIMENTS

First Embodiment

Figure 1:
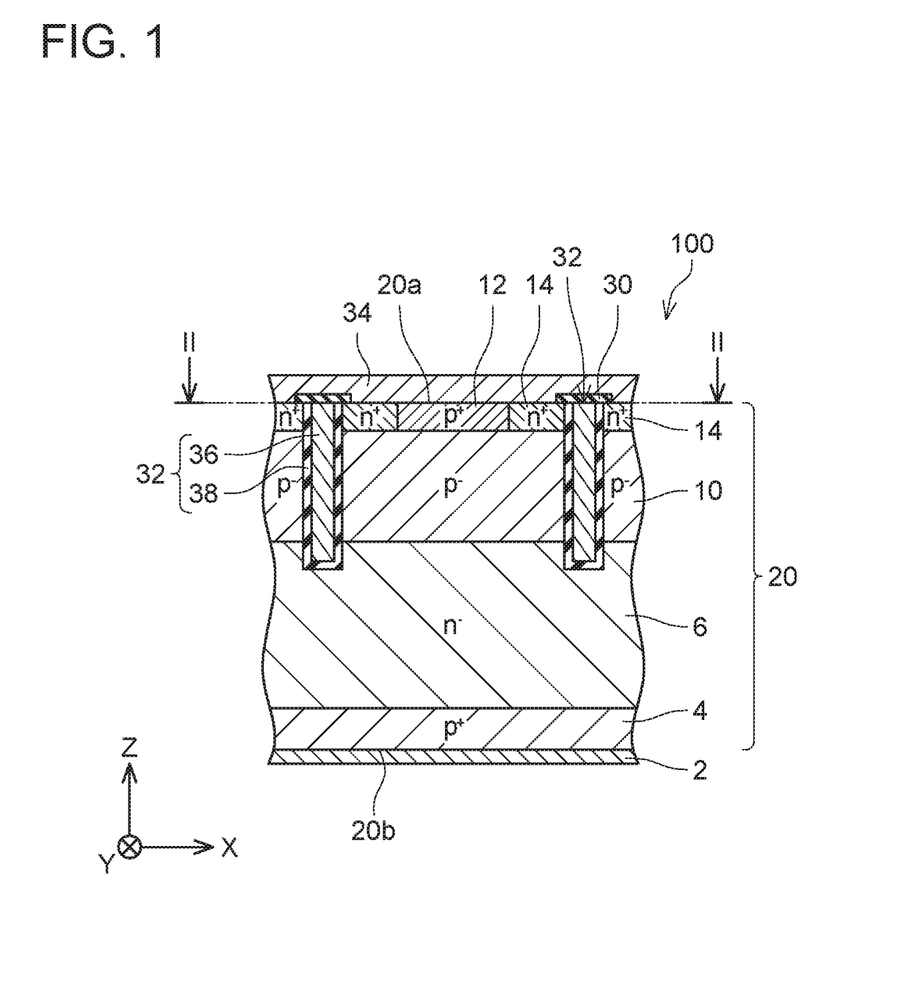
FIG. 1 shows a cross-sectional view of a main part of a semiconductor device in a first embodiment.
Figure 2:
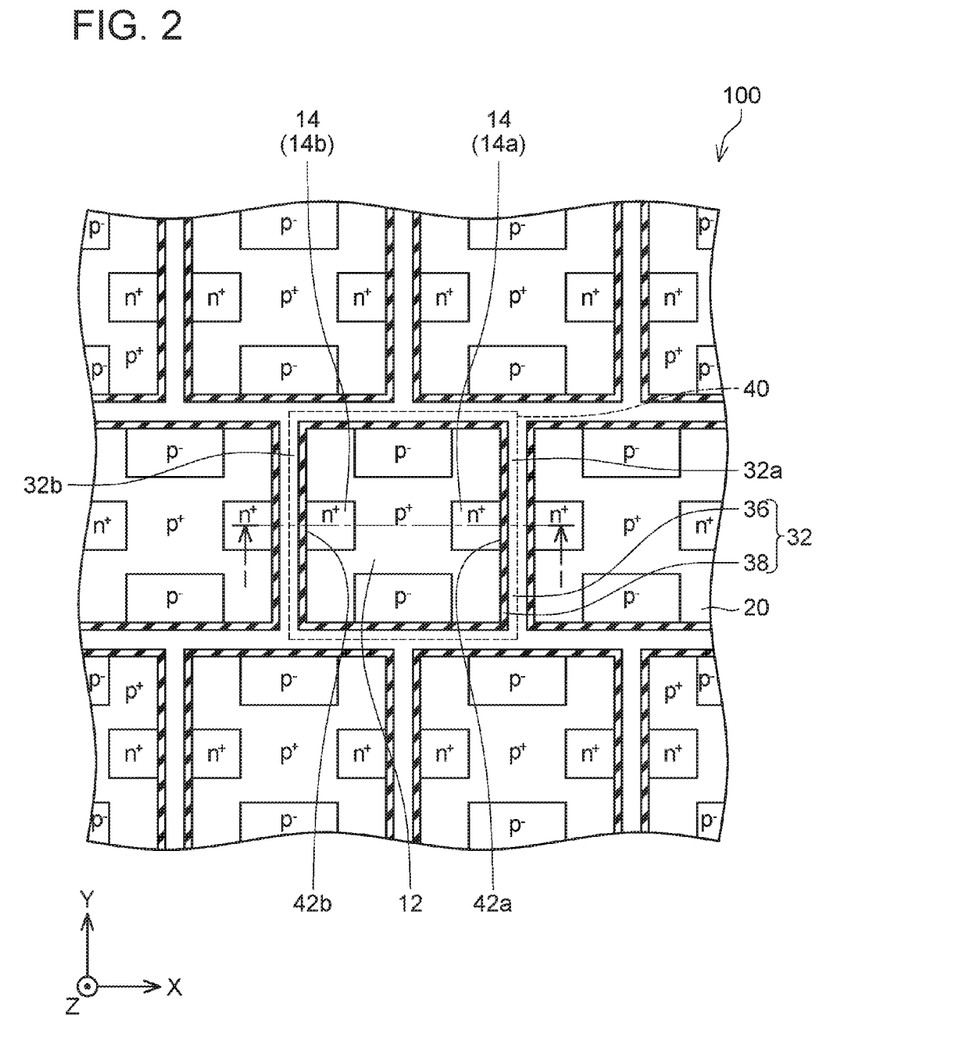
FIG. 2 shows a cross-sectional view along a line II-II in FIG. 1.

With reference to FIGS. 1 and 2, a semiconductor device 100 will be described. FIG. 1 shows a portion of the semiconductor device 100, and corresponds to a cross-section along a line I-I in FIG. 2. Moreover, FIG. 2 shows a diagram of a semiconductor layer 20 in a plan view, and corresponds to a cross-section along a line II-II in FIG. 1. In other words, FIG. 2 corresponds to a diagram in which the semiconductor device 100 is observed from a front surface side, with an emitter electrode 34 and an insulating film 30, which will be described later, being removed from the semiconductor device 100.

As shown in FIG. 1, the semiconductor device 100 comprises a pair of main electrodes (the emitter electrode 34 and a collector electrode 2), the semiconductor layer 20, and a trench gate portion 32. The emitter electrode 34 is provided on a front surface 20a of the semiconductor layer 20. The collector electrode 2 is provided on a rear surface 20b of the semiconductor layer 20. A material of the semiconductor layer 20 is silicon. The trench gate portion 32 extends toward a deep portion from the front surface 20a of the semiconductor layer 20. Notably, the semiconductor device 100 is a vertical-type IGBT.

As shown in FIG. 2, side surfaces of the trench gate portion 32 surround portions of the semiconductor layer 20. The trench gate portion 32 forms island regions 40 in the semiconductor layer 20. The trench gate portion 32 forms a plurality of island regions 40. Each of the island regions 40 is a square. In the present embodiment, among the side surfaces of the trench gate portion 32, a side surface with which a first emitter region 14a, which will be described later, is in contact is referred to as a first side surface 32a, while a side surface with which a second emitter region 14b is in contact is referred to as a second side surface 32b. The first side surface 32a and the second side surface 32b are different side surfaces, and extend in parallel.

As shown in FIG. 1, the semiconductor layer 20 comprises a p-type collector region 4, an n-type drift region 6, a p-type body region 10, n-type emitter regions 14, and p-type body contact regions 12. Each of the emitter regions 14 is an example of a first conductivity type contact region described in the appended claims. Each body contact region 12 is an example of a second conductivity type contact region described in the appended claims. The collector region 4 is provided on a rear surface side of the semiconductor layer 20. The collector electrode 2 is electrically connected to the collector region 4. The collector region 4 has boron (B) introduced therein as p-type impurities. An impurity concentration of the collector region 4 is adjusted to $1\times10^{17}$ to $5\times10^{20}$ cm$^{-3}$.

The drift region 6 is provided on a surface of the collector region 4. The drift region 6 has phosphorus (P) introduced therein as n-type impurities. An impurity concentration of the drift region 6 is adjusted to $1\times10^{12}$ to $1\times10^{15}$ cm$^{-3}$. The body region 10 is provided on a surface of the drift region 6. The body region 10 has boron introduced therein as p-type impurities. An impurity concentration of the body region 10 is adjusted to $1\times10^{16}$ to $1\times10^{19}$ cm$^{-3}$. The impurities introduced in the body region 10 have a concentration distribution. In other words, the impurity concentration of the body region 10 varies depending on positions.

Each of the emitter regions 14 is provided in a portion of a surface layer of the body region 10. The emitter regions 14 have phosphorus (P) introduced therein as n-type impurities. An impurity concentration of the emitter regions 14 is adjusted to $1\times10^{17}$ to $5\times10^{20}$ cm$^{-3}$. In other words, the impurity concentration of the emitter regions 14 is higher than that of the drift region 6. The emitter regions 14 are separated from the drift region 6 by the body region 10. Two emitter regions 14 (the first emitter region 14a and the second emitter region 14b) are provided in each island region 40. In the semiconductor device 100, the two emitter regions 14 are in contact with the trench gate portion 32 in the island region 40 (see FIG. 2). The first emitter region 14a and the second emitter region 14b are separated from each other by the body region 10. The emitter regions 14a and 14b are electrically connected to the emitter electrode 34. The first emitter region 14a is in contact with the first side surface 32a, while the second emitter region 14b is in contact with the second side surface 32b. Notably, in the description below, a range of the first side surface 32a with which the first emitter region 14a is in contact will be referred to as a first emitter contact portion 42a, and a range of the second side surface 32b with which the second emitter region 14b is in contact will be referred to as a second emitter contact portion 42b.

The body contact regions 12 are provided in a portion of the surface layer of the body region 10. The body contact regions 12 have boron introduced therein as p-type impurities. An impurity concentration of the body contact regions 12 is adjusted to $1\times10^{17}$ to $5\times10^{20}$ cm$^{-3}$. In other words, the impurity concentration of the body contact regions 12 is higher than that in the body region 10. Each body contact region 12 is in contact with the trench gate portion 32 at a position different from the position where the corresponding emitter regions 14 are in contact with the trench gate portion 32, in the surface layer of the semiconductor layer 20 (see FIG. 2). The body contact region 12 is in contact with the trench gate portion 32 at a position between the first emitter region 14a and the second emitter region 14b. The body contact regions 12 are electrically connected to the emitter electrode 34.

As described above, the trench gate portion 32 extends toward the deep portion from the front surface 20a of the semiconductor layer 20. Specifically, the trench gate portion 32 penetrates the body region 10 from the front surface 20a of the semiconductor layer 20 and reaches the drift region 6. The trench gate portion 32 includes a gate electrode 36 and a gate insulating film 38. A portion of the gate electrode 36 faces the body region 10 via the gate insulating film 38. Moreover, the insulating film 30 is provided on a surface of the trench gate portion 32. The emitter electrode 34 and the gate electrode 36 are insulated from each other by the insulating film 30.

Figure 3:
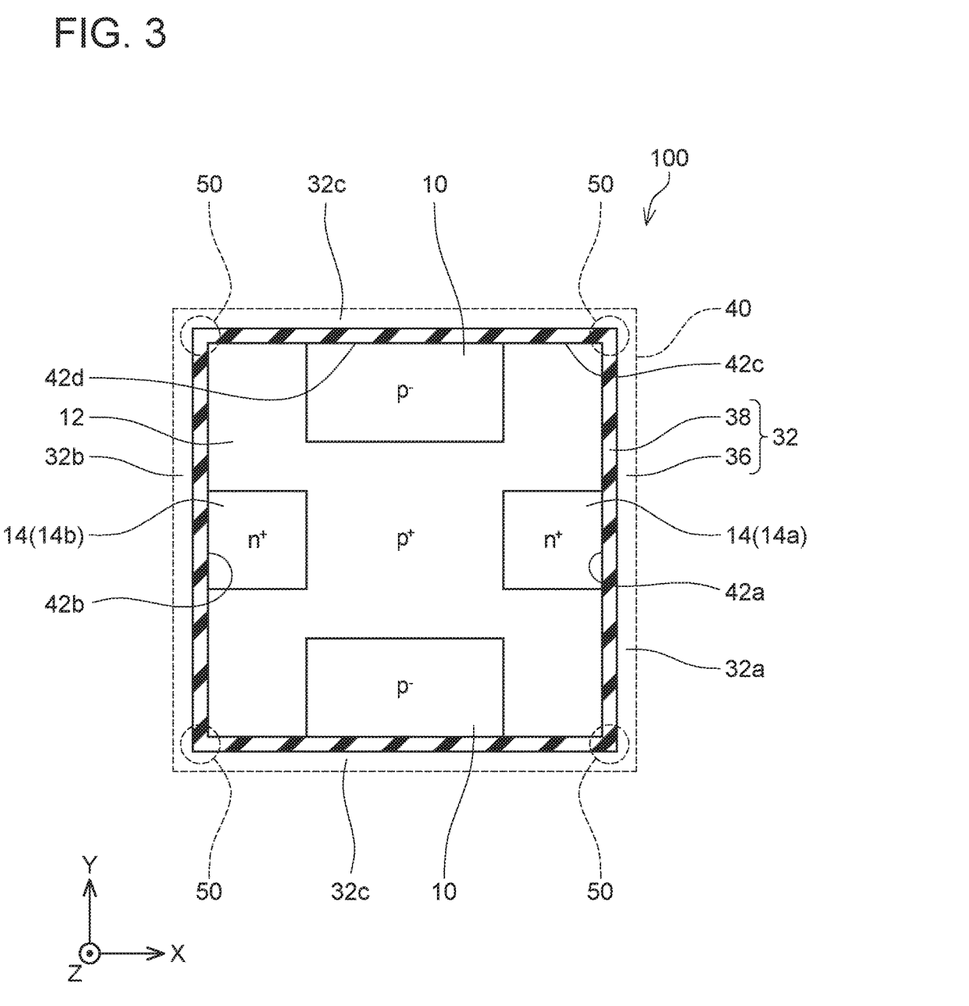
FIG. 3 shows a partially enlarged view of FIG. 2.

With reference to FIG. 3, characteristics of the semiconductor device 100 will be described in further details. FIG. 3 is an enlarged view of one island region 40. The island region 40 is defined by the first side surface 32a and the second side surface 32b, which extend in parallel to each other, and third side surfaces 32c each of which extends between the first side surface 32a and the second side surface 32b. In other words, the first side surface 32a, the second side surface 32b, and the third side surfaces 32c are in contact with the island region 40. As shown in FIG. 3, the emitter regions 14, the body contact regions 12, and the body region 10 are exposed on the front surface 20a of the semiconductor layer 20. The body region 10 that can be seen in FIG. 3 is a portion where neither emitter regions 14 nor body contact region 12 is arranged in the surface layer. In other words, there exists a portion where neither emitter regions 14 nor body contact region 12 is provided in the front surface 20a of the semiconductor layer 20 (the body region 10). The trench gate portion 32 includes portions with which the emitter regions 14 are in contact (i.e., the first emitter contact portion 42a and the second emitter contact portion 42b), a portion with which the body contact region 12 is in contact (hereinafter referred to as a contact portion 42c), and a portion with which neither emitter regions 14 nor body contact region 12 is in contact (hereinafter referred to as a non-contact portion 42d).

The contact portion 42c is provided between the first emitter contact portion 42a and the non-contact portion 42d, and between the second emitter contact portion 42b and the non-contact portion 42d. Specifically, the first emitter contact portion 42a and the contact portion 42c are provided at the first side surface 32a. The non-contact portion 42d is not provided at the first side surface 32a. In other words, the body contact region 12 is in contact with the first side surface 32a in a range from corners 50 formed by the first side surface 32a and the third side surfaces 32c to the first emitter region 14a. Similarly, the second emitter contact portion 42b and the contact portion 42c are provided at the second side surface 32b. The non-contact portion 42d is not provided at the second side surface 32b, either. The body contact region 12 is in contact with the second side surface 32b in a range from the corners 50 formed by the second side surface 32b and the third side surfaces 32c to the second emitter region 14b.

The body contact region 12 is not in contact with a portion of the third side surfaces 32c. In other words, the contact portion 42c and the non-contact portion 42d are provided at the third side surfaces 32c. Each third side surface 32c has the non-contact portion 42d provided at its center, and has the contact portion 42c provided at each of its both ends. The body contact region 12 is in contact with all of the corners 50 (the corners 50 formed by the first side surface 32a and the third side surfaces 32c, and the corners 50 formed by the second side surface 32b and the third side surfaces 32c). Each of the corners 50 is a portion of the contact portion 42c. Notably, as described above, the impurity concentration of the body region 10 varies depending on positions. In the semiconductor device 100, the impurity concentration of the body region 10 that is located in gaps between the body contact region 12 and the non-contact portion 42d of the third side surface 32c (i.e., a portion of the body region 10 exposed on the front surface 20a of the semiconductor layer 20) is adjusted to be lower than a peak impurity concentration of the body region 10.

With reference to FIG. 1, an operation of the semiconductor device 100 will be described briefly. When an on-voltage (a voltage that exceeds a threshold voltage) is applied to the gate electrode 36 in a state where the emitter electrode 34 is fixed to a ground potential and the collector electrode 2 is connected to a higher potential side of a power supply, a channel is formed at an interface between the gate insulating film 38 and the body region 10. Electrons injected from the emitter regions 14 move to the drift region 6 through the channel. Concurrently, holes are injected from the collector region 4 to the drift region 6. At this time, conductivity modulation occurs in the drift region 6, causing a decrease in electrical resistance. The electrons in the drift region 6 move to the collector region 4, and are discharged into the collector electrode 2. Moreover, the holes in the drift region 6 move to the body contact regions 12 through the body region 10, and are discharged into the emitter electrode 34. Notably, when an on-voltage is applied to the gate electrode 36, a channel is formed in the non-contact portions 42d, and not formed in the contact portions 42c, in the surface layer of the semiconductor layer 20 (see FIG. 3 as well).

Figure 8:
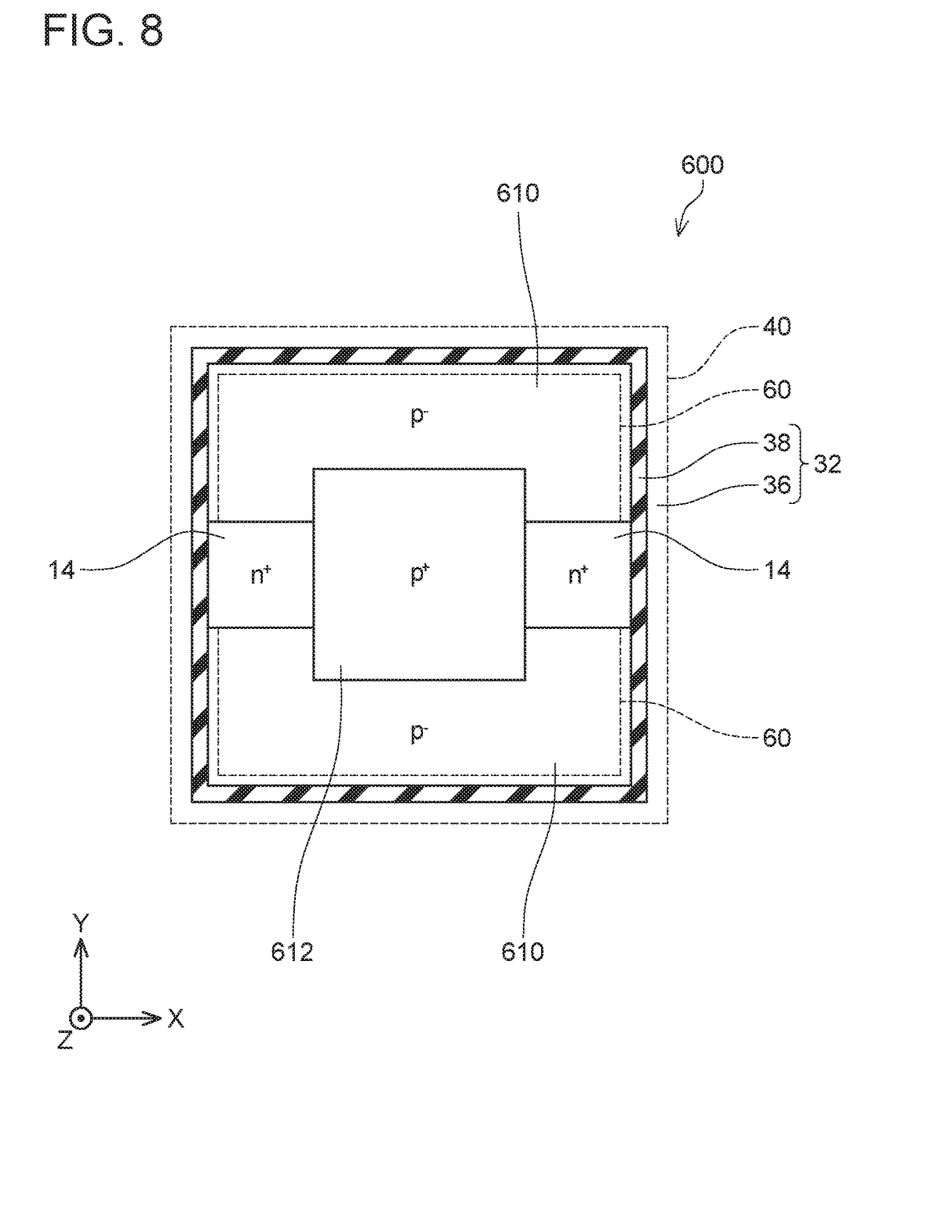
FIG. 8 shows a characteristic portion of a conventional semiconductor device.

With reference to FIGS. 3 and 8, advantages of the semiconductor device 100 will be described. FIG. 8 shows a portion of a conventional semiconductor device 600 in a plan view, and corresponds to the portion of the semiconductor device 100 in FIG. 3. Regarding the semiconductor device 600, each of the structures common to those of the semiconductor device 100 has the same reference number attached thereto, to thereby omit the description thereof. In the semiconductor device 600, a body contact region 612 is not in contact with the trench gate portion 32. Accordingly, when an on-voltage is applied to the gate electrode 36, a channel 60 is formed at an interface between the gate insulating film 38 and a body region 610 in the surface layer of the semiconductor layer. In other words, the channel 60 that connects the emitter regions 14 to each other is formed in the surface layer of the semiconductor layer. Since electrons are injected from the emitter regions 14 to the channel 60, an amount of electrons supplied to the drift region 6 is increased. Accordingly, there may be a case where saturation current increases in the semiconductor device 600.

In contrast, in the semiconductor device 100, each body contact region 12 is in contact with the trench gate portion 32 at a position between the first emitter region 14a and the second emitter region 14b (see FIG. 3). Accordingly, a channel that links the first emitter region 14a and the second emitter region 14b is not formed in the surface layer of the semiconductor layer 20. Accordingly, in the semiconductor device 100, no electrons are injected in a direction from the first emitter region 14a toward the second emitter region 14b. Similarly, no electrons are injected in a direction from the second emitter region 14b toward the first emitter region 14a, either. An amount of electrons injected from the emitter regions 14a and 14b can further be suppressed in the semiconductor device 100 than in the semiconductor device 600, and an increase in saturation current can be suppressed.

Another advantage of the semiconductor device 100 will be described. As described above, the holes injected into the drift region 6 pass through the body region 10 and the body contact regions 12, and are discharged. In the case of the semiconductor device 600 shown in FIG. 8, the body contact region 612 is disposed in a central portion of each island region 40. Accordingly, the holes that exist in a vicinity of a bottom portion of the trench gate portion 32 move in the body region 610 from an end portion of the island region 40 toward the central portion of the island region 40, so as to move to the body contact region 612. In contrast, in the semiconductor device 100, the body contact region 12 is in contact with the trench gate portion 32. The holes that exist in a vicinity of the bottom portion of the trench gate portion 32 move in the body region 10 along the trench gate portion 32. A distance by which the holes move in the body region 10 is shorter in the semiconductor device 100 than in the semiconductor device 600. An amount of holes that exist in the body region 10 can be suppressed, resulting in that an amount of electrons injected from the emitter regions 14 can be suppressed. In the semiconductor device 100, a distance by which holes move in the body region 10 can be reduced to thereby suppress an increase in saturation current.

As described above, each third side surface 32c includes the contact portion 42c with which the body contact region 12 is in contact, and the non-contact portion 42d with which the body contact region 12 is not in contact. With the provision of the non-contact portion 42d, an increase in on-resistance (transfer resistance of electrons) can be suppressed. Notably, in the semiconductor device 100, the contact portion 42c links to the first emitter contact portion 42a and the second emitter contact portion 42b. In other words, the emitter regions 14 and the body contact region 12 are in contact with each other in a direction along which the first side surface 32a and the second side surface 32b extend. Accordingly, a channel that links to the emitter regions 14 is not formed in the surface layer of the semiconductor layer 20.

As described above, the impurity concentration of the body region 10 that is located in the gaps between the body contact region 12 and the non-contact portion 42d of the third side surfaces 32c is adjusted to be lower than the peak impurity concentration of the body region 10. Consequently, when an on-voltage is applied to the gate electrode 36, a channel is reliably formed in the non-contact portion 42d, and an increase in on-resistance can be prevented. Moreover, since the corners 50 are included in a portion of the contact portion 42c, current can be prevented from flowing in each of the corners of each island region 40 in a concentrated manner.

Notably, the art disclosed herein can take various forms in a semiconductor device where an island region is formed by the trench gate portion. With reference to FIGS. 4 to 7, semiconductor devices (semiconductor devices 200 to 500) in second to fifth embodiments will hereinafter be described. Notably, in the description below, regarding the semiconductor devices 200 to 500, each of the structures common to those of the semiconductor device 100 may have the same reference number as that in the semiconductor device 100, attached thereto, to thereby omit the description thereof.

Second Embodiment

Figure 4:
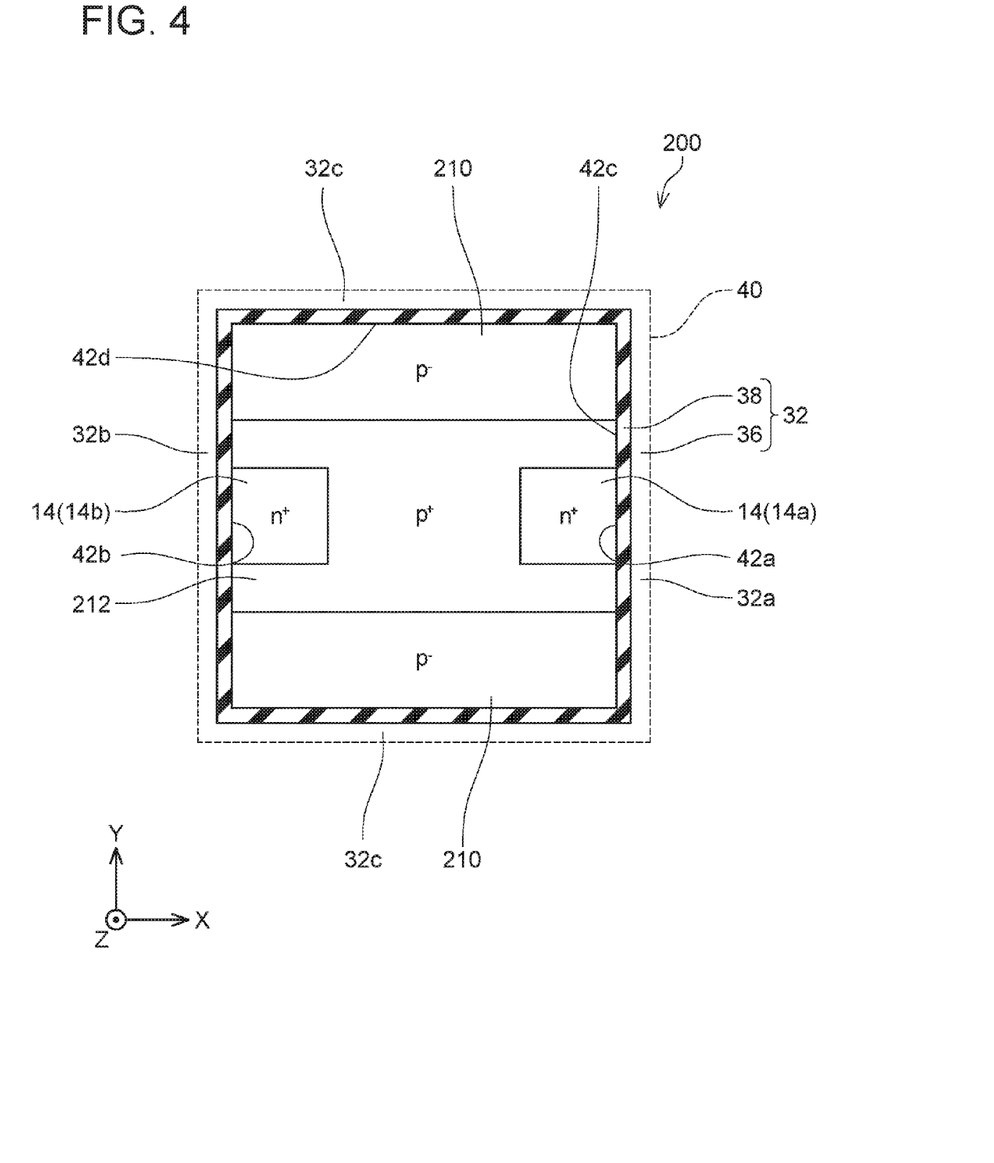
FIG. 4 shows a characteristic portion of a semiconductor device in a second embodiment.

With reference to FIG. 4, characteristics of the semiconductor device 200 will be described. In the semiconductor device 200, a body contact region 212 is in contact exclusively with the first side surface 32a and the second side surface 32b. As the body contact region 212 is positioned between the body regions 210, the body contact region 212 is not in contact with the third side surfaces 32c. Accordingly, a wide range where a channel is to be formed can be ensured in the surface layer of the semiconductor layer 20. In the semiconductor device 200, an on-resistance can be suppressed to a further lower on-resistance. Notably, in the semiconductor device 200, as in the semiconductor device 100 as well, the emitter regions 14 and the body contact region 212 are in contact with each other in the direction along which the first side surface 32a and the second side surface 32b extend. Accordingly, in the semiconductor device 200 as well, a channel that links to the emitter regions 14 can be prevented from being formed in the surface layer of the semiconductor layer 20.

Third Embodiment

Figure 5:
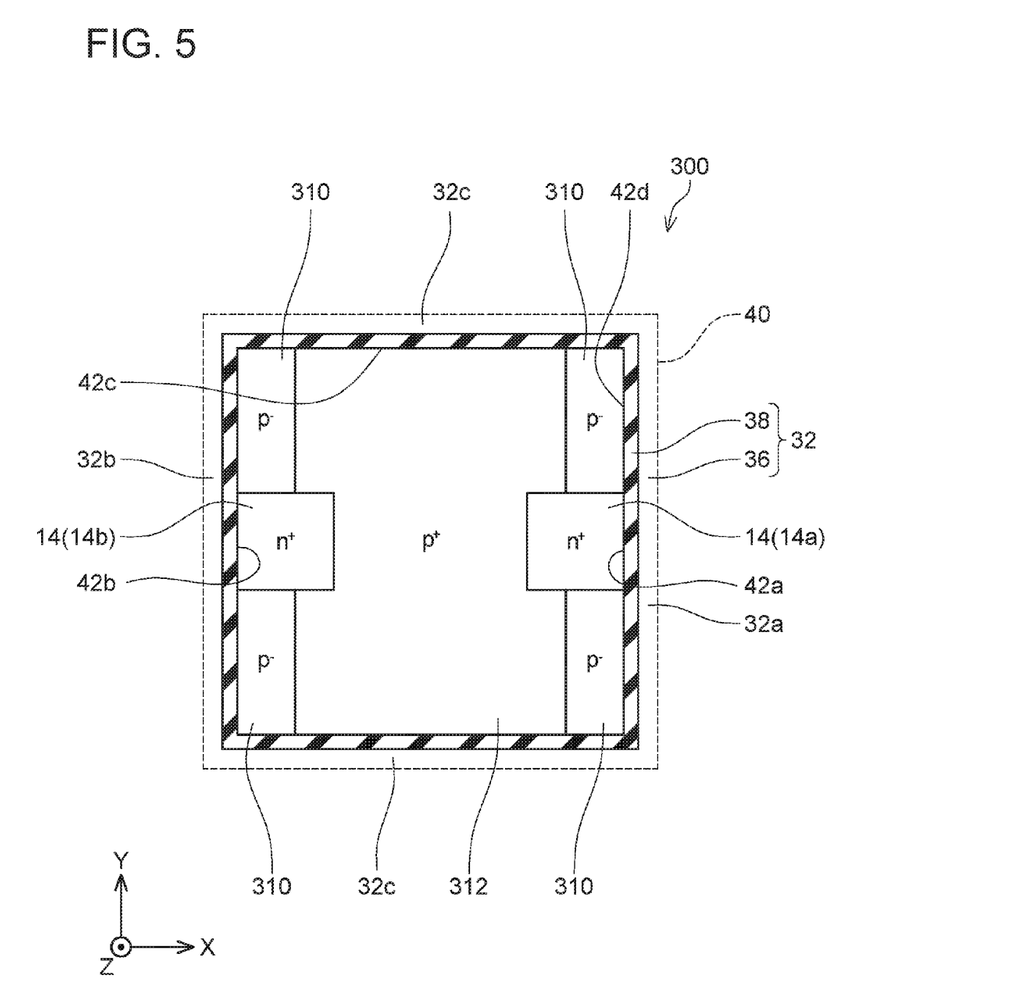
FIG. 5 shows a characteristic portion of a semiconductor device in a third embodiment.

With reference to FIG. 5, characteristics of the semiconductor device 300 will be described. In the semiconductor device 300, a body contact region 312 is in contact exclusively with the third side surfaces 32c. In the semiconductor device 300, the body regions are provided on either side of the first emitter region 14a and the second emitter region 14b. In the semiconductor device 300 as well, the first emitter region 14a and the second emitter region 14b are prevented from being linked by a channel in the surface layer of the semiconductor layer 20.

Fourth Embodiment

Figure 6:
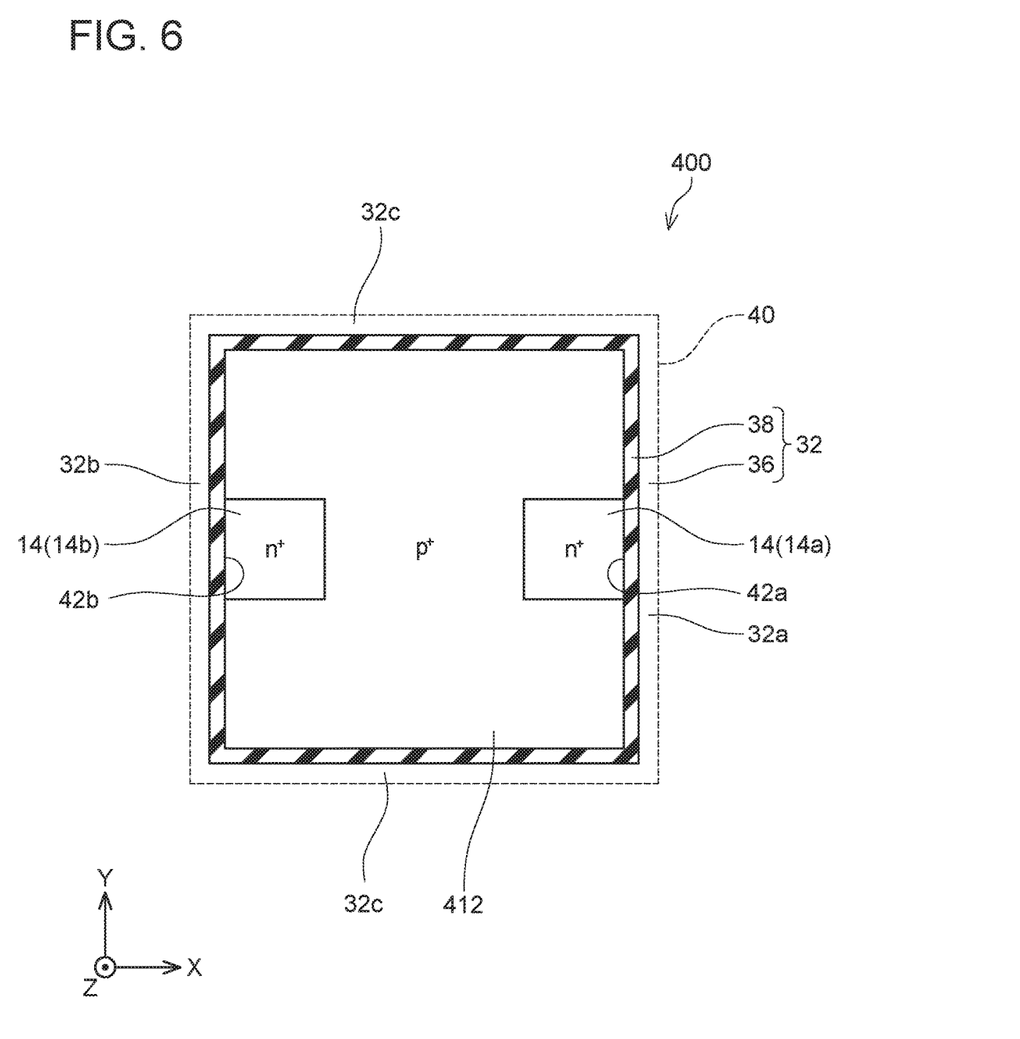
FIG. 6 shows a characteristic portion of a semiconductor device in a fourth embodiment.

With reference to FIG. 6, characteristics of the semiconductor device 400 will be described. In the semiconductor device 400, a body contact region 412 is provided in the entire surface layer of the body region 10, except for a portion where the emitter regions 14 are located. In the semiconductor device 400, no channel is formed at all in the surface layer of the semiconductor layer 20. Accordingly, saturation current can be made further smaller.

Fifth Embodiment

Figure 7:
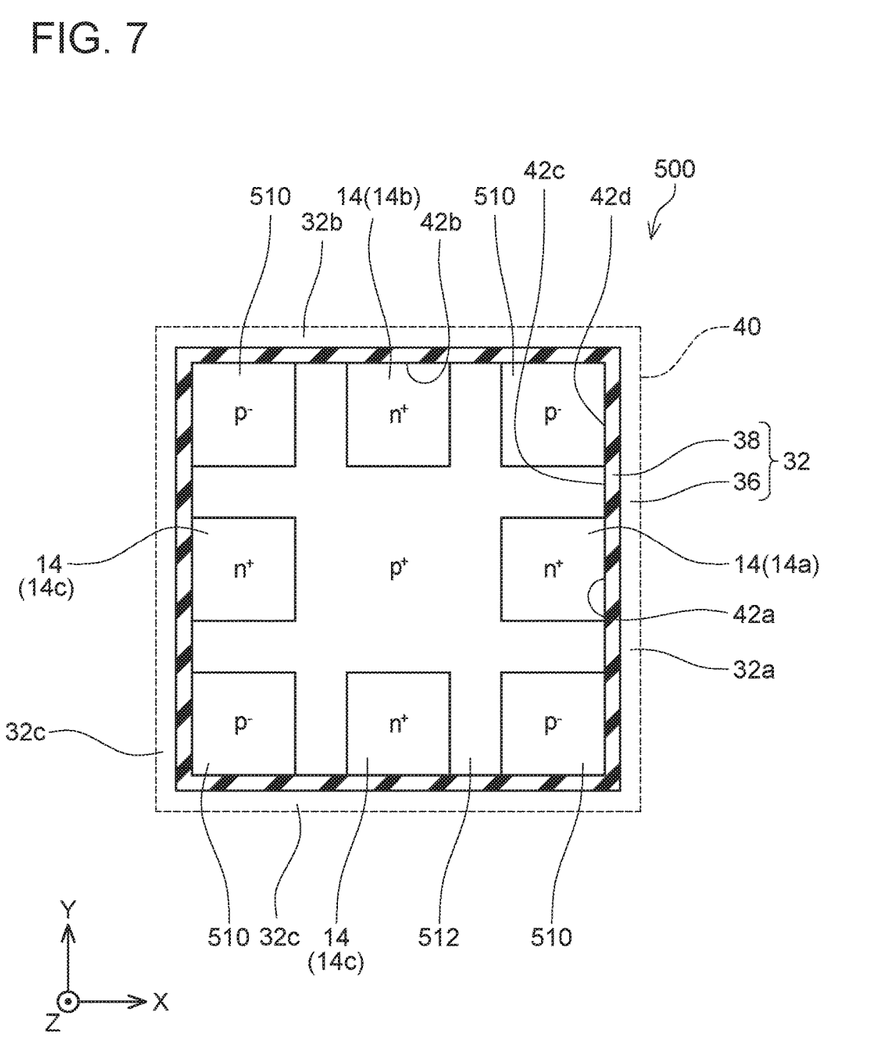
FIG. 7 shows a characteristic portion of a semiconductor device in a fifth embodiment.

With reference to FIG. 7, the semiconductor device 500 will be described. In the semiconductor device 500, the emitter regions 14 are in contact with all the side surfaces of the trench gate portion 32. The first side surface 32a with which the first emitter region 14a is in contact, and the second side surface 32b with which the second emitter region 14b adjacent to the first emitter region 14a is in contact, are adjacent side surfaces that share a vertex. Each of the third side surfaces 32c with which a third emitter region 14c is in contact are adjacent side surfaces that share a vertex. In the semiconductor device 500, the body regions 510 are provided so as to contact adjacent side surfaces that share a vertex. In the semiconductor device 500 as well, a body contact region 512 is in contact with the trench gate portion 32 at a position between the emitter regions 14a and 14b, and hence the emitter regions 14a and 14b are prevented from being connected by a channel in the surface layer of the semiconductor layer 20.

In the above-described embodiments, a bipolar transistor that includes a trench gate portion (i.e., an IGBT) has been illustrated. However, the art disclosed herein can also be applied to a unipolar transistor that includes a trench gate portion (e.g., a MOSFET). What is important is that, in the semiconductor device where the trench gate portion forms the island region and a plurality of electron supply regions (the emitter regions in each of the embodiments) is provided in the island region, the body contact region is in contact with the trench gate portion at a position between the adjacent electron supply regions.

Specific examples of the present teachings are described above in detail, but these examples are merely illustrative and place no limitation on the scope of the patent claims. The technology described in the patent claims also encompasses various changes and modifications to the specific examples described above. The technical elements explained in the present disclosure or drawings provide technical utility either independently or through various combinations. The present teachings are not limited to the combinations described at the time the claims are filed. Further, the purpose of the examples shown by the present disclosure or drawings is to satisfy multiple objectives simultaneously, and satisfying any one of those objectives gives technical utility to the present teachings.

What is claimed is:

1. A semiconductor device comprising a semiconductor layer and a trench gate portion that extends toward a deep portion from a front surface of the semiconductor layer, wherein the semiconductor layer comprises:
   a drift region which is of a first conductivity type;
   a body region which is of a second conductivity type and is provided on a surface of the drift region;
   a first conductivity type contact region that is provided in a portion of a surface layer of the body region, and is separated from the drift region by the body region; and
   a second conductivity type contact region that is provided in another portion of the surface layer of the body region, and includes second conductivity type impurities of a higher concentration than that in the body region,
the semiconductor layer comprises an island region surrounded by the trench gate portion in a plan view,
the trench gate portion includes a first side surface that is in contact with the island region and a second side surface that is in contact with the island region and is different from the first side surface,
the first conductivity type contact region includes a first contact region that is in contact with the first side surface in the island region and a second contact region that is in contact with the second side surface in the island region, and
the second conductivity type contact region is in contact with the trench gate portion at a position between the first contact region and the second contact region.

2. The semiconductor device according to claim 1, wherein
   the first side surface of the trench gate portion and the second side surface of the trench gate portion are parallel to each other,
   the trench gate portion further comprises a third side surface being in contact with the island region and extending between the first side surface and the second side surface,
   the second conductivity type contact region is in contact with the first side surface in a range from a corner formed by the first side surface and the third side surface to the first contact region, and
   the second conductivity type contact region is further in contact with the second side surface in a range from a corner formed by the second side surface and the third side surface to the second contact region.

3. The semiconductor device according to claim 2, wherein the second conductivity type contact region is in contact with the corner formed by the first side surface and the third side surface and is in contact with the corner formed by the second side surface and the third side surface.

4. The semiconductor device according to claim 3, wherein the second conductivity type contact region is not in contact with a portion of the third side surface.

5. The semiconductor device according to claim 4, wherein an impurity concentration of the body region that is located in a gap between the second conductivity type contact region and the third side surface is lower than a peak impurity concentration of the body region.

* * * * *

UNITED STATES PATENT AND TRADEMARK OFFICE
CERTIFICATE OF CORRECTION

| | | |
|---|---|---|
| PATENT NO. | : 9,595,603 B2 | Page 1 of 1 |
| APPLICATION NO. | : 15/188584 | |
| DATED | : March 14, 2017 | |
| INVENTOR(S) | : Hirabayashi et al. | |

It is certified that error appears in the above-identified patent and that said Letters Patent is hereby corrected as shown below:

On the Title Page

Item (56), Foreign Patent Documents, Cite No. 2 delete "6087272" and insert --5087272--, therefor.

Signed and Sealed this
Second Day of May, 2017

Michelle K. Lee
*Director of the United States Patent and Trademark Office*